(12) United States Patent
Ebner et al.

(10) Patent No.: US 7,405,682 B2
(45) Date of Patent: Jul. 29, 2008

(54) DELTA-SIGMA ANALOG DIGITAL CONVERTER WITH OFFSET COMPENSATION

(75) Inventors: Christian Ebner, München (DE); Gerhard Mitteregger, Taufkirchen (DE)

(73) Assignee: National Semiconductor Germany AG, Unterhaching (DE)

( * ) Notice: Subject to any disclaimer, the term of this patent is extended or adjusted under 35 U.S.C. 154(b) by 0 days.

(21) Appl. No.: 11/656,056

(22) Filed: Jan. 22, 2007

(65) Prior Publication Data

US 2007/0216557 A1 Sep. 20, 2007

(30) Foreign Application Priority Data

Jan. 30, 2006 (DE) .................. 10 2006 004 212

(51) Int. Cl.
*H03M 1/10* (2006.01)

(52) U.S. Cl. ...................... 341/120; 341/143

(58) Field of Classification Search .......... 341/115–155
See application file for complete search history.

(56) References Cited

U.S. PATENT DOCUMENTS 6,462,687 B1 * 10/2002 Eshraghi et al. ............. 341/143
2004/0263370 A1 12/2004 Oliaei et al.

2005/0206543 A1 9/2005 Draxelmayer et al.

FOREIGN PATENT DOCUMENTS

DE 10 2004 009 611 A1 9/2005
DE 601 13 442 T2 1/2006

OTHER PUBLICATIONS

Moyal, et al.,"A 700/900m W/Channel CMOS Dual Analog Front-End IC for VDSL with Integrated 11.5/14.5dBm Line Drivers"; 2003; IEEE International Solid-State Circuits Conference, Mixed-Signal and Wireline Techniques, Paper 23.6, pp. 1-10.

* cited by examiner

*Primary Examiner*—Lam T Mai
(74) *Attorney, Agent, or Firm*—Pearne & Gordon LLP

(57) ABSTRACT

The invention concerns a time-continuous delta-sigma analog-digital converter for the conversion of an analog input signal into a digital output signal, comprising an analog filter for the filtering of the analog input signal, a clocked operated quantiser, which contains at least one comparator (34) and which quantises the filtered analog signal outputted through the analog filter for the generation of the digital output signal, and a feedback arrangement with at least one digital-analog converter, which supplies to the analog filter at least one feedback signal on the basis of the digital output signal. According to the invention a calibration device (32) linked with the quantiser is stipulated, which is designed to determine at a predetermined point in time an offset error of the comparator (34) and subsequently to compensate for this (Itrim).

10 Claims, 3 Drawing Sheets

DELTA-SIGMA ANALOG DIGITAL CONVERTER WITH OFFSET COMPENSATION

BACKGROUND TO THE INVENTION

1. Field of the Invention

The present invention concerns a delta-sigma analog-digital converter for the conversion of an analog input signal into a digital output signal, comprising:

an analog filter for the filtering of the analog input signal, a quantiser clocked by a clock signal, which contains at least one comparator and quantises the filtered analog signal outputted through the analog filter for the generation of the digital output signal, and a feedback arrangement with at least one digital-analog converter, which supplies to the analog filter at least one analog feedback signal on the basis of the digital output signal.

Furthermore the invention concerns a corresponding conversion method.

2. Description of the Prior Art

From DE 10 2004 009 611 A1, for example, a converter of this kind is of known art. In this prior art according to one form of embodiment a quantiser is provided which consists of one comparator and delivers a digital quantiser output signal with one bit resolution. In an alternative form of embodiment the quantiser has a plurality of quantising stages and delivers a digital output signal comprising a plurality of bits. The design and the function of the quantiser are not described in any further detail in this publication.

A fundamental problem with conventional continuous-time delta-sigma analog-digital converters is the so-called offset error of the one or more comparators that are used in the quantiser for the quantisation of the signal supplied. Such a comparator offset error can for example lead to the fact that for an input signal that lies just underneath the comparator threshold, the comparator output signal assumes a value that is stipulated for input signals lying above the comparator threshold. The reverse case is also conceivable. The offset error thus leads ultimately to the fact that under certain circumstances the comparator concerned comes to the incorrect decision. It is clear that this error affects the quality of the delta-sigma analog-digital converter disadvantageously. This problem is particularly serious if the quantiser has a plurality of comparators in order to deliver a comparison result with multiple bit resolution. In this case not only does the offset error of a comparator as such possess relevance for the conversion quality, but so also does the fact that the individual offset errors of the majority of comparators differ from one another in an undefined manner.

A possible option for improvement of the converter quality consists in making the total system less sensitive to offset errors in the region of the quantiser. However this is either linked with a relatively high level of complexity in terms of circuitry or possesses other disadvantages, such as e.g. a reduction of the converter resolution as a result of a reduction of the resolution of the quantiser. Another possible approach for improvement of the converter quality consists in implementing the one or more comparators of the quantiser according to established circuitry concepts using field effect transistors, wherein these transistors are however designed with a particularly large surface area and/or length. This would indeed reduce the offset error of the comparator, but leads to a disadvantageous increase in the power requirement, i.e. current requirement, of the comparator and the upstream part of the circuitry.

SUMMARY OF THE INVENTION

It is an object of the present invention to make available a delta-sigma analog-digital converter of the kind cited in the introduction, in which despite a simpler and/or current-saving configuration for the one or more comparators provided in the quantiser good performance characteristics can be achieved for the converter.

This object is essentially achieved according to the invention, in that the converter also has a calibration device linked with the quantiser, which device is designed to determine an offset error of the comparator at a predetermined point in time and subsequently to compensate for this error.

The offset compensation stipulated according to the invention enables the implementation of a delta-sigma analog-digital converter with outstanding performance characteristics, e.g. with a signal band ranging up to very high frequencies with, at the same time, low power requirement and high quality (e.g. linearity) for the output signal. In particular in this connection a form of embodiment is of advantage in which the quantiser has a plurality of quantising stages and/or the digital output signal of the quantiser possesses a thermometer coding. In one form of embodiment, for example, the quantiser has 16 quantising stages (corresponding to 4 bits). For both rapid quantisation and also rapid digital-analog conversion in the feedback arrangement it is of advantage if the digital output signal of the quantiser possesses a thermometer coding.

If the quantiser contains a plurality of comparators then the calibration stipulated according to the invention is preferably stipulated separately for each of the individual comparators. This advantageously allows for the fact that in practice the offset errors of a plurality of comparators differ from one another to a greater or lesser extent.

In a particularly preferred form of embodiment an operational start-up of the converter is stipulated as the point in time for the determination of the offset error and its subsequent compensation. In practice such a "one-off calibration" is completely sufficient for the subsequent converter operation, which under certain circumstances can be extended, since the offset error is primarily of a kind determined purely by the production process, and is not significantly influenced by variations occurring during operation such as temperature fluctuations. However, within the framework of the invention the possibility should not be excluded that other alternative or additional points in time may be selected for the calibration.

For the art and manner of the calibration there are many options. For example the calibration device could in the first instance measure i.e. determine suitable predetermined parameters in the region of the comparator concerned, in order to extract significant information, i.e. a quantitative estimation of the offset error, which is used in the subsequent compensation. Such a calibration method can for example comprise the following steps:

application of a predetermined test signal at the input of the comparator, evaluation of the reaction of the comparator to the test signal, and subsequent compensation of the offset error on the basis of the evaluation result.

In a preferred development of the invention it is stipulated that the calibration performed by the calibration device comprises the following steps:

application of a test signal corresponding to the comparator threshold at the input of the comparator, determination of the decision of the comparator in reaction to the test signal, variation of the test signal in order to determine that test signal magnitude, in what follows designated as the compensation signal, at which the comparator makes the opposite decision ("tips over"), storage of the compensation signal for at least as long as until a renewed calibration takes place, or the operation of the converter is interrupted, and compensation of the offset error by the additional application of the compensation signal to the comparator during the converter operation.

In a modified calibration method it is stipulated that the first two steps cited above are replaced by the following step:

application of a test signal corresponding to a particular decision of the comparator at the input of the comparator.

Both methods similarly deliver a measured "compensation signal" suitable for offset compensation.

For the art and manner of the variation of the test signal to determine the compensation signal there are many options. Possible in principle would be, for example, a "successive approximation", in which the test signal magnitude necessary for tipping over the comparator (=compensation signal) is determined in as rapid a manner as possible. However, a variation method of the kind that is optimised with regard to the speed of determination is manifestly linked with a certain complexity in terms of circuitry in the region of the calibration device, and in particular this is hardly beneficial if the calibration, as already noted above, is only performed at the operational start-up of the converter. On grounds of simplicity of implementation in terms of circuitry, therefore, a method of determination is in many cases preferred in which the test signal magnitude is altered monotonically until the comparator tips over.

If the calibration comprises an application of a predetermined test signal to the input of the comparator, this test signal can then be generated and/or adjusted in a particularly simple manner, e.g. digitally by the calibration device. For this purpose a digital counter to which a clock signal is applied can be used, for example, whose output signal is applied to a digital-analog converter, whose output signal is then used as a monotonically varying test signal.

Such a digital generation of the test signal also possesses the advantage that the compensation signal determined can also be stored in a simple manner in digital form, in order to use the stored value to generate the compensation signal required during converter operation.

The invention is equally suitable for converters working in continuous time and for converters working in discrete time. What is essential is just the use of a quantiser, which has one or a plurality of comparators.

In one form of embodiment it is stipulated that the converter possesses a full-differential design, in which the analog input signal is supplied in differential form and the digital output signal is made available in differential form. The invention is, however, in principle also suitable for so-called "single ended" circuitry concepts.

A preferred production technology for the delta-sigma analog-digital converter is CMOS technology. The converter can in particular represent a function block of an integrated circuit arrangement.

If the converter is designed in full-differential form, and a test signal at the input of the comparator is overlaid on a test input signal to determine the compensation signal, it is preferred that the two potentials defining the test input signal correspond to the so-called common mode voltage.

In a manner known per se the quantiser can be located downstream of a digital processor (DSP) for the further processing of the digital output signal. In this case the digital output signal can be branched off from a circuit node arranged between the quantiser and the digital signal processor and can be supplied to the feedback arrangement.

The features of the above-described forms of embodiment and/or further developments of the invention can of course also advantageously be combined with one another.

SHORT DESCRIPTION OF THE DRAWINGS

In what follows the invention is further described with the aid of an example of embodiment with reference to the accompanying drawings. In the figures.

DESCRIPTION OF THE PREFERRED EMBODIMENT(S)

Figure 1:
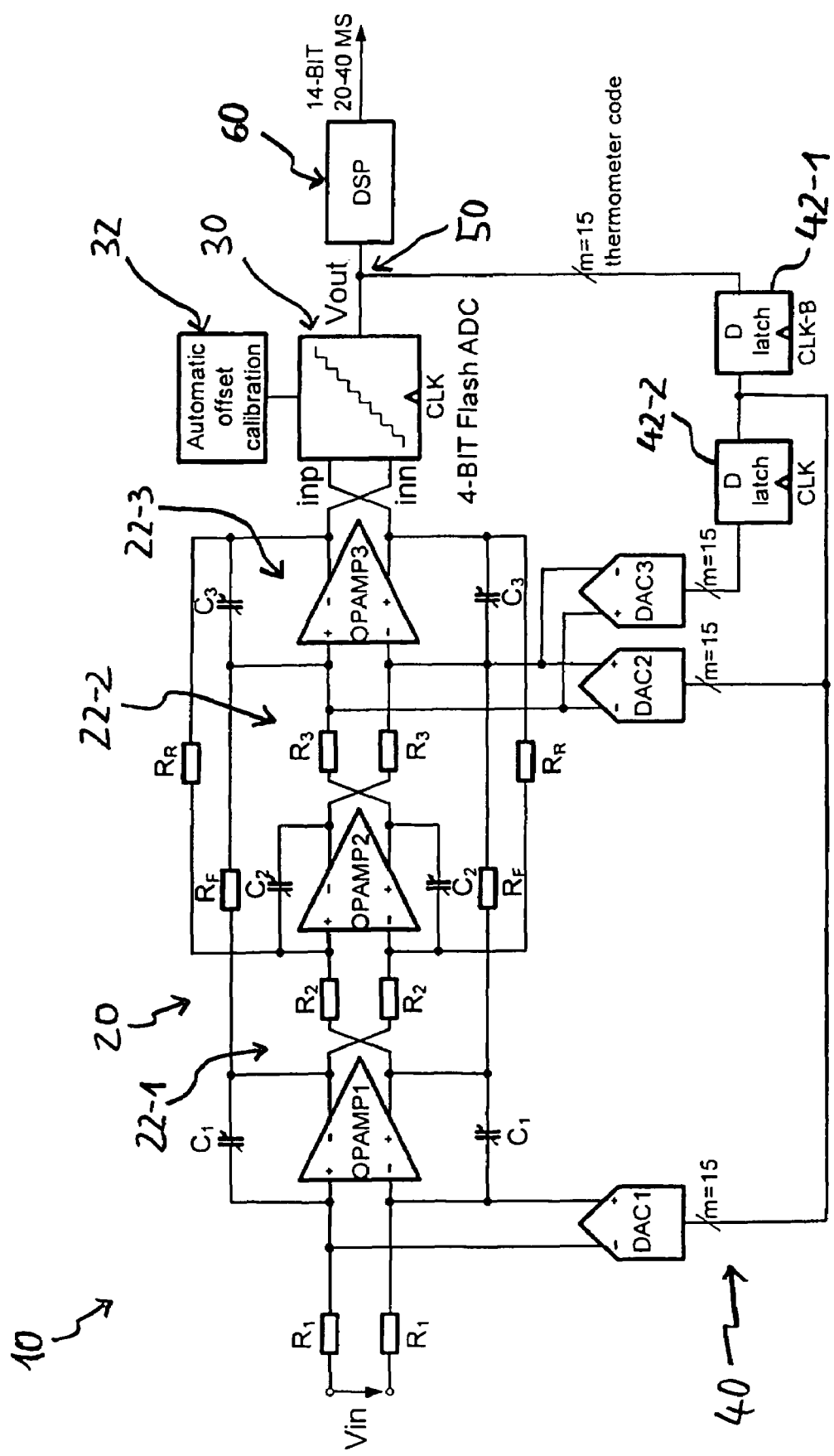
FIG. 1 shows a block circuit diagram of a delta-sigma analog-digital converter.

FIG. 1 illustrates the design of a delta-sigma analog-digital converter 10 for the conversion of an analog input signal Vin into a digital output signal Vout. The analog input signal Vin is represented by an input voltage and the digital output signal by an output voltage signal.

The converter 10 comprises an analog filter 20 to filter the analog input signal Vin, a 4-bit quantiser 30, clocked by a clock signal, to generate the digital output signal Vout by quantising the signal outputted from the analog filter 20, and a feedback arrangement 40 to feedback analog feedback signals on the basis of the digital output signal Vout.

In completely general terms, in a delta-sigma analog-digital converter the integrated (" sigma") difference ("delta") between an analog input signal and an analog representation of the quantised digital output signal is supplied to the quantiser (analog-digital converter stage). In another embodiment of such a converter, strictly speaking designated a "delta modulator", the difference ("delta") between an analog input signal and the integral ("sigma") of the quantised digital output signal is supplied to the quantiser. By means of the feedback the quantiser generates an output bit stream, whose time-average value follows the analog input signal. Compared with delta-sigma analog-digital converters working in discrete time, the delta-sigma analog-digital converter working in continuous time offers the advantage of a lower power consumption, or for a prescribed power consumption, the advantage of a higher signal bandwidth.

In the example of embodiment represented the analog filter 20 comprises a plurality of integrators 22-1, 22-2 and 22-3 (an integrator cascade), which form a filter network. The configuration of the filter 20 represented is only to be understood as an example, of course, and can be modified extensively in a manner known per se.

In the implementation represented the integrators 22-1, 22-2 and 22-3 of the analog filter 20 are respectively implemented in terms of suitably externally circuited operational amplifiers OPAMP1, OPAMP2 and OPAMP3. As represented the external circuit consists of suitably dimensioned resistances R and capacitances C.

Figure 2:
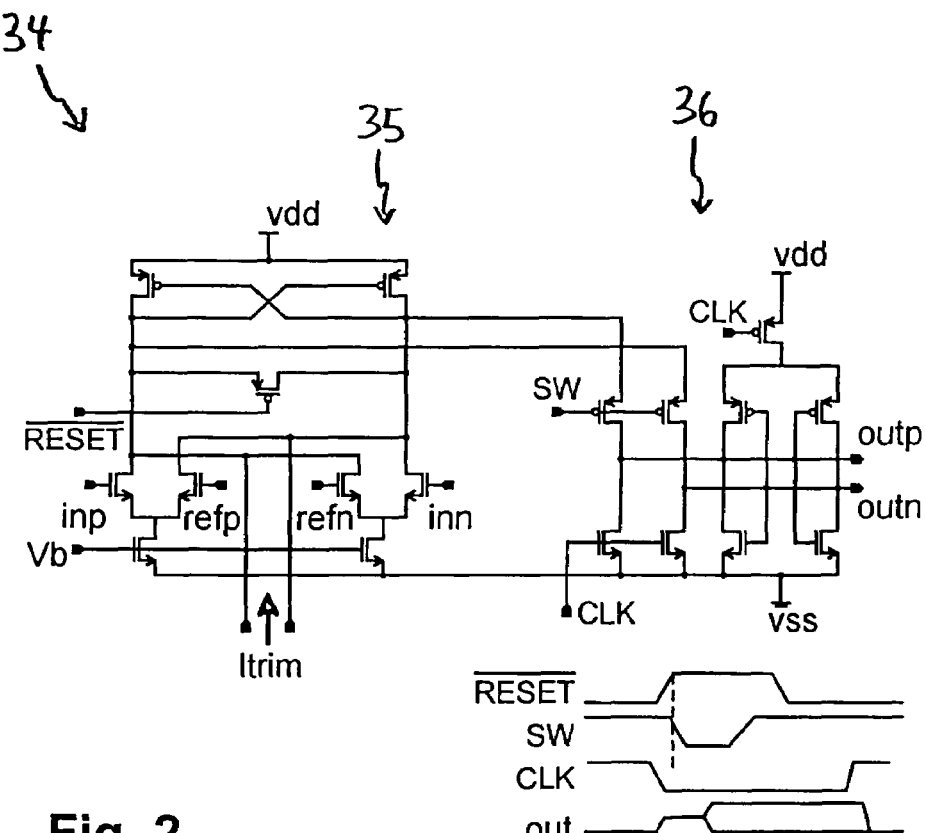
FIG. 2 shows a circuit diagram of a full-differential comparator as it is contained in the quantiser of the converter represented in FIG. 1.

The quantiser 30 possesses 16 quantising stages and represents the output signal Vout in a thermometer code on 15 output lines, which for the sake of simplicity of the representation of FIG. 1 are symbolised by just a single line connection. For this purpose the quantiser 30 is designed in a manner known per se as a parallel circuit of 15 comparators (c.f. FIG. 2) with 15 comparator thresholds in arranged in a "ladder". A common clock signal CLK is supplied simultaneously to the comparators; by means of this signal the respective comparisons of the filtered input signal with the comparator thresholds are performed at discrete-time periodic times, so that a 4-bit output. signal Vout is present at the output of the quantiser 30, made available in a clocked manner. The physical representation is carried out according to the thermometer code in 15 digital voltages (symbolised by Vout).

Furthermore one can see in FIG. 1 a digital signal processor (DSP) 60 for the further digital processing of the bit stream outputted from the quantiser 30.

The feedback arrangement 40 of the converter 10 is essentially formed by the circuit components 42-1, 42-2, DAC1, DAC2 and DAC3, which are described in what follows. Each of these components is simply drawn in FIG. 1 for the sake of simplicity of representation. In actual fact these components are provided in parallel with one another in a 15-fold embodiment, corresponding to the processing of the signal transmitted via 15 lines in accordance with a thermometer code.

A first feedback path runs from a branch node 52 to the first integrator 22-1 of the analog filter 20 and comprises a clocked digital signal store 42-1, designed as a so-called "latch", and driven by the clock signal CLK (more accurately: by the inverted version CLK-B of the clock signal CLK), to which the digital output signal Vout is supplied, and whose output signal in turn is inputted to the input of a digital-analog converter DAC1. The output signal of the digital-analog converter DAC1 is supplied as a full-differential current signal to the integrator 22-1. In the region of the integrator 22-1 an addition is implemented of the currents provided via coupling resistances R1 and at the output of the digital-analog converter DAC1.

The latch 42-1 is a register, whose output signal follows the input signal if the inputted clock signal CLK-B possesses one particular state of the two possible clock signal states (the clock signal effectively serves as a "permission signal"). With the customary use of a rectangular clock signal CLK, which in the first half of a clock period possesses a logical level "1" and in the second half of the clock period possesses a logical level "0", the output signal Vout ensues at the output of the signal store 42-1, delayed by the half clock period of the clock signal CLK. In terms of circuitry the signal store 42-1 drawn in FIG. 1 in actual fact consists of a parallel arrangement of 15 1-bit signal stores for the parallel delay of the signal level represented on 15 lines.

The output signal Vout, delayed by a half clock period by the signal store 42-1, is also supplied to the input of a digital-analog converter DAC2, which at its output provides a full-differential current signal (corresponding to the result of the digital-analog conversion). The output signal of the digital signal store 42-1 is also inputted to the input of a second digital signal store 42-2, which is designed in the same manner as the first signal store 42-1, but which is driven with the non-inverted clock signal CLK. The second signal store 42-2 delays the signal that it is supplied to it by a further half clock period of the clock signal CLK, so that by connecting in series the signal stores 42-1 and 42-2, acting as delay elements, a version of the output signal Vout is provided at the output of the second signal store 42-2 that is delayed overall by a complete clock period T of the clock signal CLK. This output signal of the second signal store 42-2 is supplied to the input of a digital-analog converter DAC3 which (in the same manner as the digital-analog converter DAC2) delivers a full-differential current signal which, in the same manner as the output signal of the digital-analog converter DAC2, is stored in the region of the integrator 22-3.

The two signal stores 42-1, 42-2 and the two digital-analog converters DAC2, DAC3 together form a function block of the feedback arrangement 40, generating a feedback signal corresponding to the differentiated output signal Vout of the quantiser 30. The generation of this differentiated signal is here based on the analog subtraction of two signals, which, starting from the digital output signal, are provided by the provision of different delays and a digital-analog conversion in each case.

For an exact adjustment of the comparator thresholds in the operation of the converter 10 an adjustment and/or calibration circuit 32 is provided for each comparator as described in detail below.

FIG. 2 illustrates the design of a comparator 34 which is formed from a comparator input stage 35 and a comparator output stage 36 and in an identical 15-fold embodiment is contained in a parallel arrangement in the quantiser 30 (FIG. 1).

Although the circuitry concept on which the function of the comparator represented in FIG. 2 is based is known per se and within the framework of the invention can also be modified without further effort, the function of the comparator 34 should be briefly elucidated. In the comparison performed in a clocked manner by the comparator 34 of a differential input signal with a differential reference signal (potentials inp, refp, refn, inn) is, as represented, some of the transistors contained in the comparator are controlled by control signals RESET (or an inverted version of this), SW, CLK. The time-wise behaviour of these digital control signals is represented in an exemplary manner in the lower part of FIG. 2. At this location the ensuing comparator output signal out (the difference between the output potentials outp and outn) is also represented. The potentials vss and vdd denote the supply potentials of the comparator 34, i.e. of the whole converter 10.

Before the start of a comparison procedure the transistor controlled by the reset signal RESET is conducting. The transistors controlled by the signal SW are blocking.

The comparison procedure begins with a change in the state of the RESET signal, as a result of which the transistor controlled by this signal is brought into the blocking state, and the input stage "tips" as a function of the input signals into one of two possible stable states. As a result of the subsequent change in the state of the signal SW the corresponding state of the input stage 35 is transferred to the output stage 36 and is called on for the output of clearly defined output potentials outp, outn by means of that part of the circuitry represented on the far right-hand side in FIG. 2. This part of the circuitry ensures that one of the output potentials outp, outn is "pulled" to the supply potential vdd and the other to the supply potential vss. Immediately before the transfer of the state from the input stage 35 to the output stage 36 the latter is held by the clock signal CLK in a predefined state.

The transistor pairs contained in the input stage 35, which are controlled by the input signals. inp, refp, refn, inn and in each case are supplied by a current source transistor (controlled by an adjustment voltage Vb), are identically specified, but have to a greater or lesser extent tolerances in their properties as determined by the production process. From this there results to a greater or lesser extent an offset error in the comparator 34, which under particular circumstances leads to the fact that the comparison result delivered at the output of the stage 35, and thus at the output of the stage 36 also, is defective.

This offset error, which can be quite different for each of the total of 15 comparators 34, is measured by 15 calibration circuits (in each case associated with one of the comparators) at the start-up of converter operation and is compensated for (at least partially) in the subsequent operation.

FIG. 3 shows once again one of the comparators 34 in a simplified block circuit diagram together with the associated calibration circuit 32.

The calibration procedure (measurement of and compensation for the offset error) proceeds as follows: Firstly, as is symbolised in FIG. 3, a test input potential VCM corresponding to the common mode potential of the comparator 34 is applied to all input connections of the comparator 34. In the example of embodiment represented VCM lies at least approximately midway between vss and vdd. Here the test signal VCM is, by means of a control unit not represented in the figure, applied at a predetermined point in time in order to move the comparator 34 concerned into a "calibration mode".

On the basis of the mode of operation of the comparator 34 elucidated above the latter will come to one of two possible decisions (comparison results) and make this available at its output. This comparator decision is registered by the logic circuit 37 represented in just a simplified manner in FIG. 3, which also receives a representative control signal "TRIM_MODE" for the calibration mode from the control unit. When this logic circuit 37 has registered the comparator decision in the calibration mode, it controls a digital counter 38 via an "ENABLE" signal such that a downstream digital-analog converter 39 feeds a monotonically varying test signal (current signal) Itrim to the input of the comparator 34. This feed process can be seen in more detail in the representation in FIG. 2. It is overlaid on the constant test input signal inputted via the input connections inp, inn, refp, refn. Whether the current signal Itrim, starting from the value zero, monotonically rises or falls is determined by the logic circuit 37, such that the variation of this test signal after a certain time leads to the "tipping over" of the comparator 34, i.e. the comparator output signal changes its state.

The change of the comparator output state is again registered by the logic circuit 37, which thereupon stops the digital counter 38. The value then stored as a counter state in the digital counter 38 up to the next calibration process is a quantitative measure for the offset error of the comparator 34 and is used for the subsequent converter operation to generate a compensation signal that compensates for this offset error. The not-represented control device ends the calibration mode (by a change of the TRIM_MODE signal) and normal operation of the converter 10 can begin.

Figure 3:
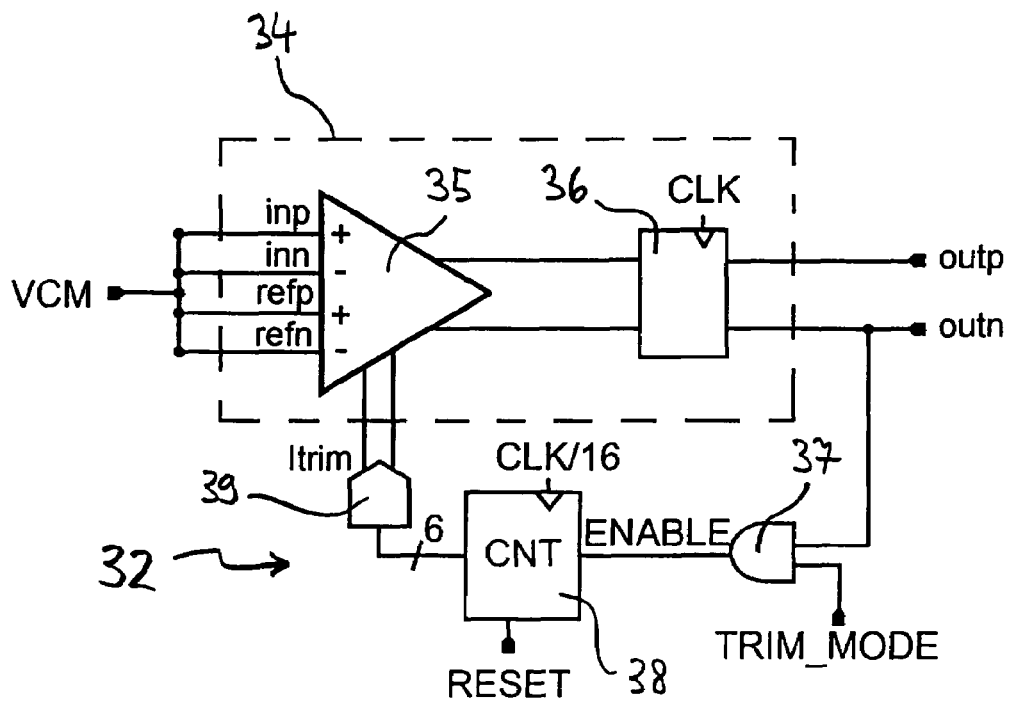
FIG. 3 shows a simplified block circuit diagram of the comparator of FIG. 2 together with associated calibration circuitry.

Advantageously in the form of embodiment represented in FIG. 3 not only the digital counter 38 possesses a dual function (during the determination of the offset error and the storage of a suitable test signal magnitude). The digital-analog converter 39 located downstream of the digital counter 38 is also used in the following compensation of the offset error. On the basis of the counter state stored in the counter 38 this converter 39 generates the compensation signal Itrim suitable for an essentially complete compensation of the offset error. Thus during normal operation the offset error is actually compensated for in the input stage 35 of the comparator 34 by the current signal Itrim overlaid on the input signals.

Figure 4:
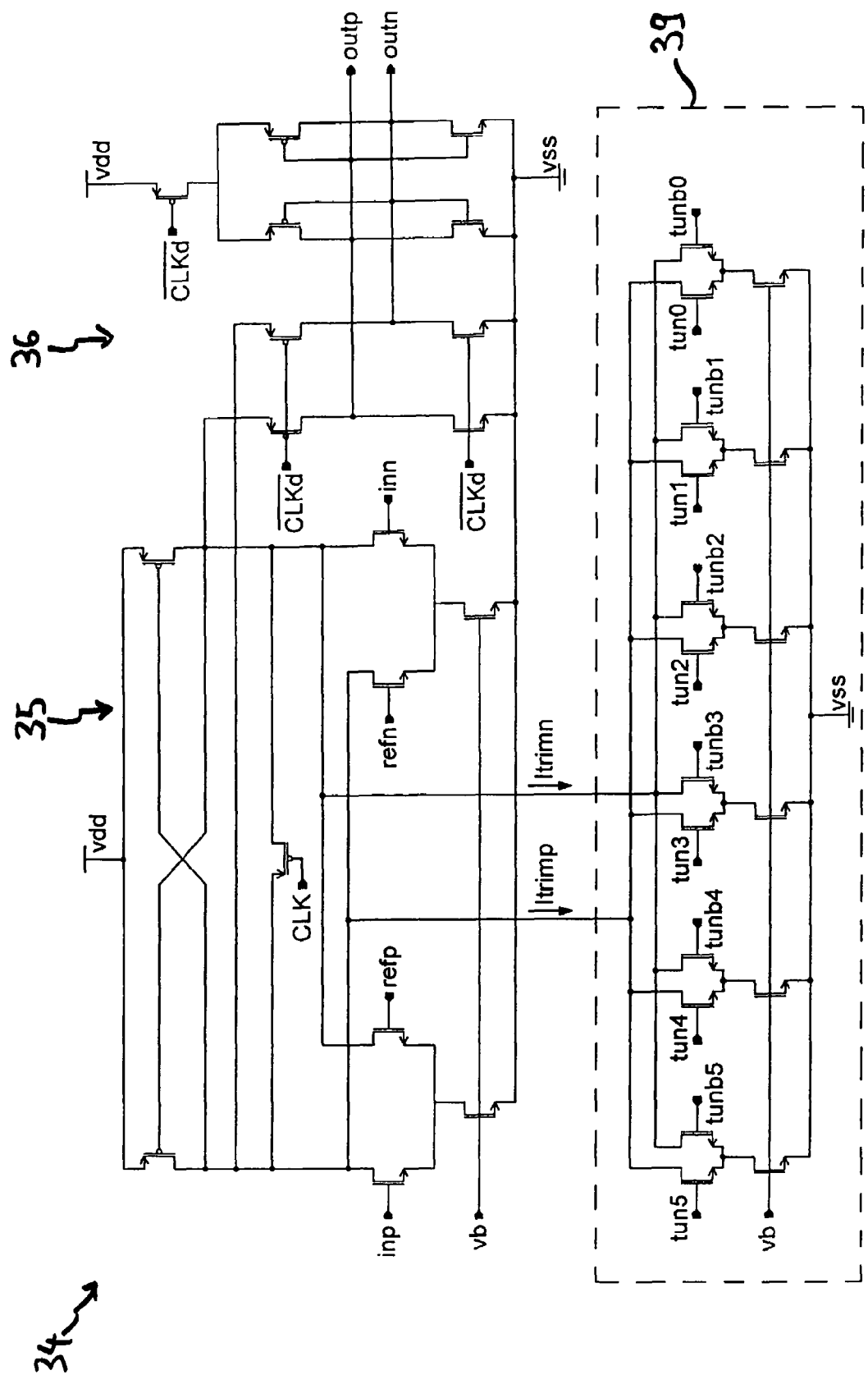
FIG. 4 shows an implementation in terms of circuitry of the essential components of the arrangement represented in FIG. 3.

In FIG. 4 the design of the comparator 34 is once again represented in more detail and in addition is drawn in an implementation in terms of circuitry of the digital-analog converter 39 that is linked with it. In this implementation six differential digital input signals tuni and tunbi (with i=0 . . . 5) are provided for the control of respective switching transistor pairs, to which in each case a current adjustment transistor is applied (adjustment potential vb). With appropriate digital control the individual transistor pairs deliver individual current contributions to the adjustment current Itrim to be transferred to the comparator 34. In the example of embodiment represented these individual current contributions of the transistor pairs are weighted according to a binary code (in the ratio 1:2:4:8:16:32). This type of code, and also the design of the converter 39, are, however, only to be understood as examples and can be extensively modified within the framework of the invention. The control code is delivered from the digital counter 38 (c.f. FIG. 3) not represented in FIG. 4.

In the described example of embodiment of the invention transistors with a small transistor length or transistor surface area can be used in the design of the comparators 34. The offset voltage problem is solved by an adjustment and/or calibration circuit such as the circuit 32 described. The calibration device, designed as an appropriately large number of such circuits, measures the offset of each comparator and compensates for this. The resolution of the quantiser (number of bits) is therefore advantageously not limited by the offset problem and the feedback arrangement 40, as also the analog filter 20, can be configured in a manner in which the offset error of the comparators no longer needs to be taken into account. Instead of the single calibration immediately before the start-up of converter operation stipulated in the example of embodiment, such a calibration can of course also take place continuously, perhaps periodically, during converter operation.

The invention claimed is:

1. A delta-sigma analog-digital converter (10) for the conversion of an analog input signal (Vin) into a digital output signal (Vout), comprising:
   an analog filter (20) for the filtering of the analog input signal,
   a quantiser (30) clocked by a clock signal (CLK), which comprises at least one comparator (34) and quantises the filtered analog signal outputted by the analog filter (20) for the generation of the digital output signal,
   a feedback arrangement (40) with at least one digital-analog converter (DAC1, DAC2, DAC3), which supplies to the analog filter (20) at least one analog feedback signal on the basis of the digital output signal (Vout), and
   a calibration device (32) linked with the quantiser (30), which is designed at a predetermined point in time to determine an offset error of the comparator (34) and subsequently to compensate for this.

2. The converter according to claim 1, wherein the converter is designed such that an operational start-up of the converter (10) is stipulated as the point in time for the determination of the offset error and its subsequent compensation.

3. The converter according to claim 1, wherein the calibration device is adapted to perform a calibration, including following steps:
   application of a predetermined test signal (VCM, Itrim) at the input of the comparator (34),
   evaluation of the reaction of the comparator (34) to the test signal, and
   subsequent compensation of the offset error on the basis of the evaluation result.

4. The converter according to claim 1, wherein the calibration device is adapted to perform a calibration, including following steps:

application of a test signal (VCM, Itrim) corresponding to the comparator threshold at the input of the comparator (34), determination of the decision of the comparator (34) in reaction to the test signal (VCM, Itrim), variation of the test signal (VCM, Itrim) in order to determine that test signal magnitude, in what follows designated as the compensation signal (Itrim), at which the comparator (34) makes the opposite decision, storage of the compensation signal for at least as long as until a renewed calibration takes place, or the operation of the converter (10) is interrupted, and compensation of the offset error by additional application of the compensation signal (Itrim) to the comparator (34) during the converter operation.

5. The converter according to claim 1, wherein the calibration device is adapted to perform a calibration, including following steps:

application of a test signal (VCM, Itrim) corresponding to a particular decision of the comparator (34) at the input of the comparator (34), variation of the test signal (VCM, Itrim) in order to determine that test signal magnitude, in what follows designated as the compensation signal (Itrim), at which the comparator (34) makes the opposite decision, storage of the compensation signal for at least as long as until a renewed calibration takes place, or the operation of the converter (10) is interrupted, and compensation of the offset error by additional application of the compensation signal (Itrim) to the comparator (34) during the converter operation.

6. The converter according to claim 4, wherein the variation of the test signal magnitude is provided as a monotonic variation until the comparator (34) tips over.

7. The converter according to claim 3, wherein the calibration device (32) generates the test signal (VCM, Itrim) digitally.

8. The converter according to claim 1, further comprising a full-differential design.

9. The converter according to claim 1, wherein the quantiser (30) has a plurality of quantising stages.

10. The converter according to claim 1, wherein the digital output signal (Vout) of the quantiser (30) possesses a thermometer code.

* * * * *